United States Patent [19]

Watkin

[11] 4,248,508
[45] Feb. 3, 1981

[54] PROJECTION MASK STORAGE AND CARRIER SYSTEM

[75] Inventor: Theodore Watkin, Stamford, Conn.

[73] Assignee: The Perkin-Elmer Corporation, Norwalk, Conn.

[21] Appl. No.: 63,494

[22] Filed: Aug. 3, 1979

[51] Int. Cl.$^3$ .............................................. G03B 23/14
[52] U.S. Cl. .................................. 353/114; 353/120; 353/121; 353/118
[58] Field of Search ............... 353/103, 114, 116, 117, 353/118, 120, 121, 122; 206/455, 456

[56] References Cited

U.S. PATENT DOCUMENTS

| 3,997,256 | 12/1976 | Wells | 353/116 X |
| 4,006,980 | 2/1977 | Wells | 353/118 |
| 4,053,215 | 10/1977 | Haning et al. | 353/118 X |

Primary Examiner—Harry N. Haroian
Attorney, Agent, or Firm—Salvatore A. Giarratana; Francis L. Masselle; Edwin T. Grimes

[57] ABSTRACT

There is disclosed a system for storing a projection mask of the type used for printing integrated circuit patterns on silicon wafers. A special cassette package permits the mask to be stored in a clean sealed environment. A delivery system transports the sealed cassette into an optical projection instrument wherein the cassette is opened and the mask advanced to the projection stage. After projection, the mask is returned and automatically sealed into the cassette. The cassette may be evacuated or, alternatively, filled with a clean gas. The mask sealed in the cassette can then be stored until its use is again required.

22 Claims, 19 Drawing Figures

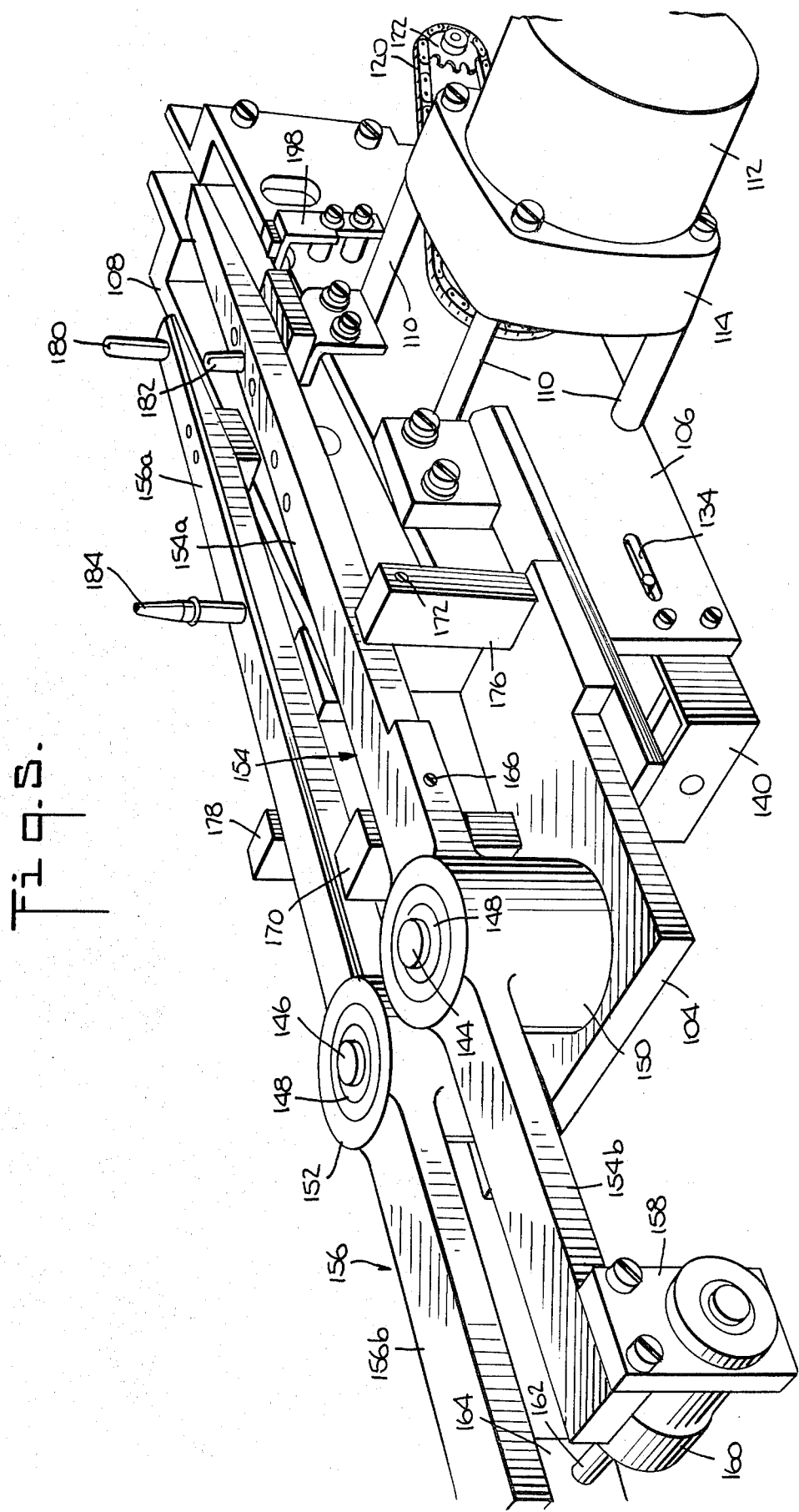

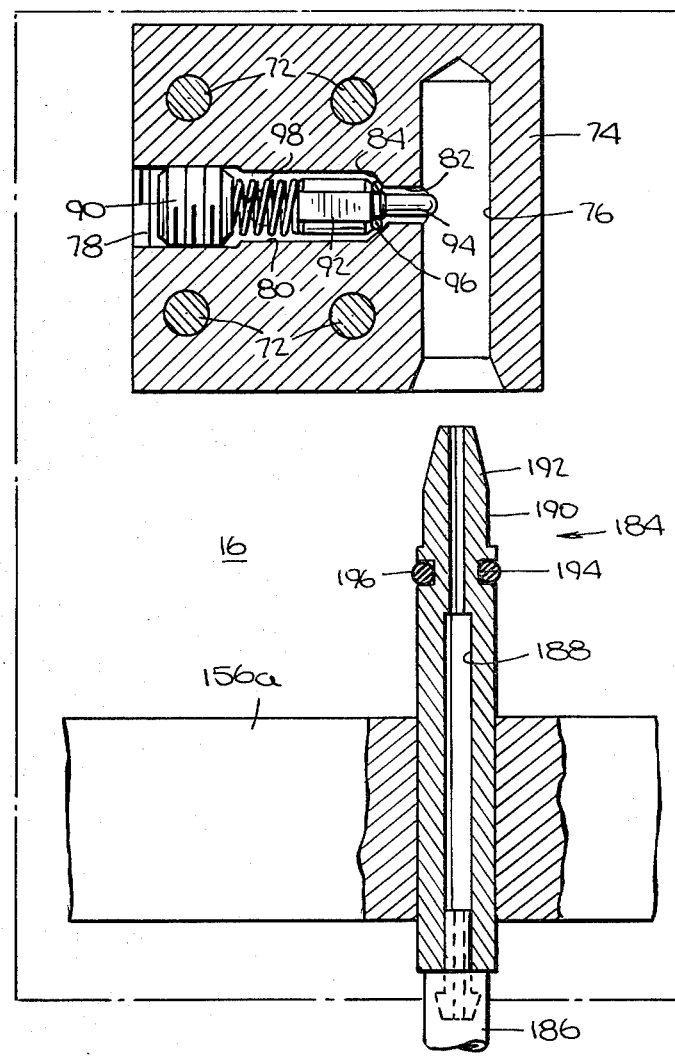
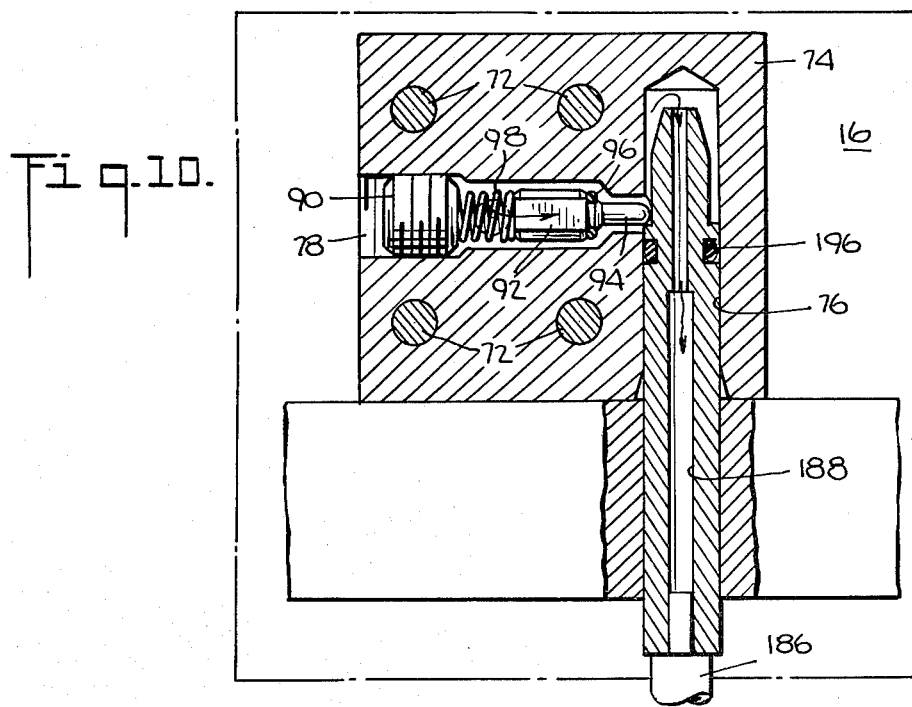
Fig.9.
Fig.10.

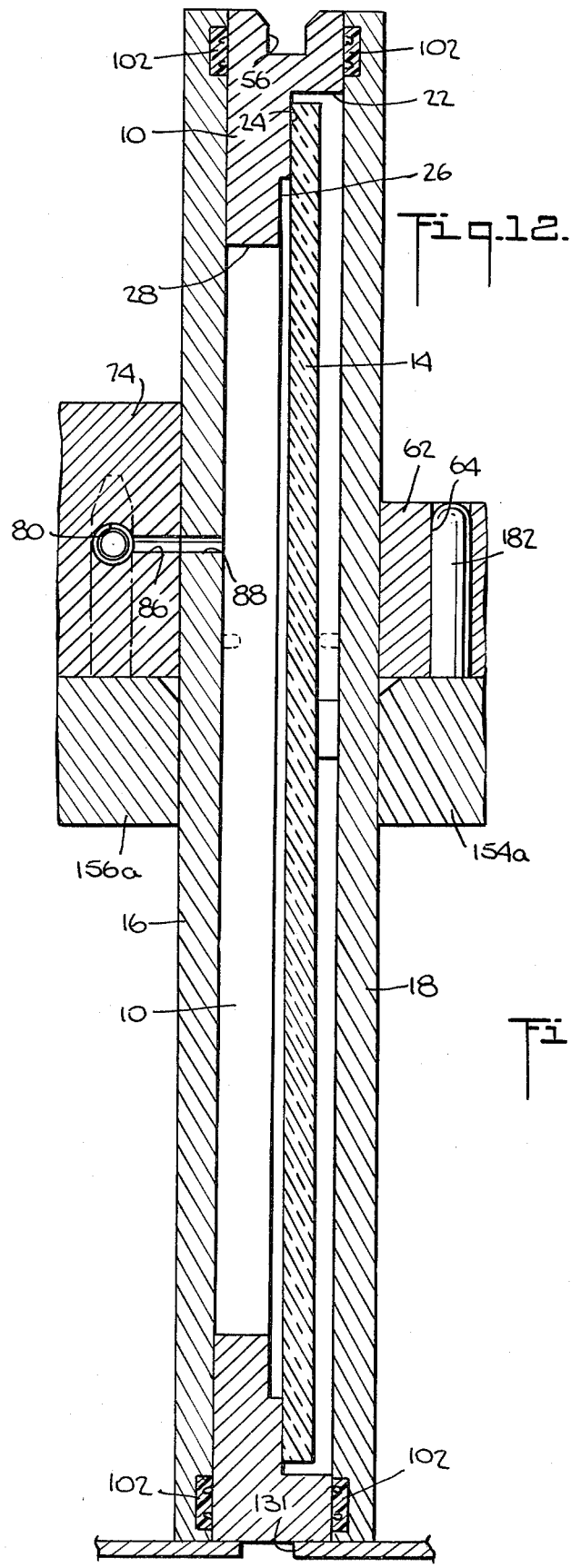
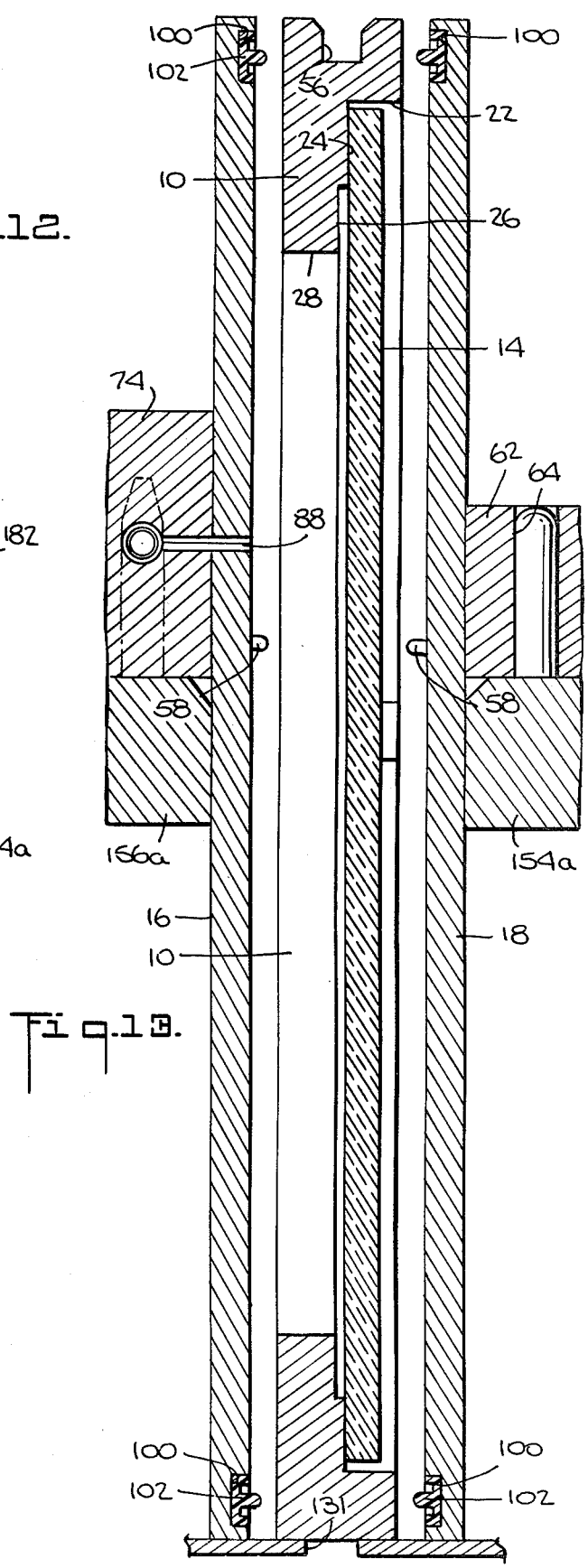

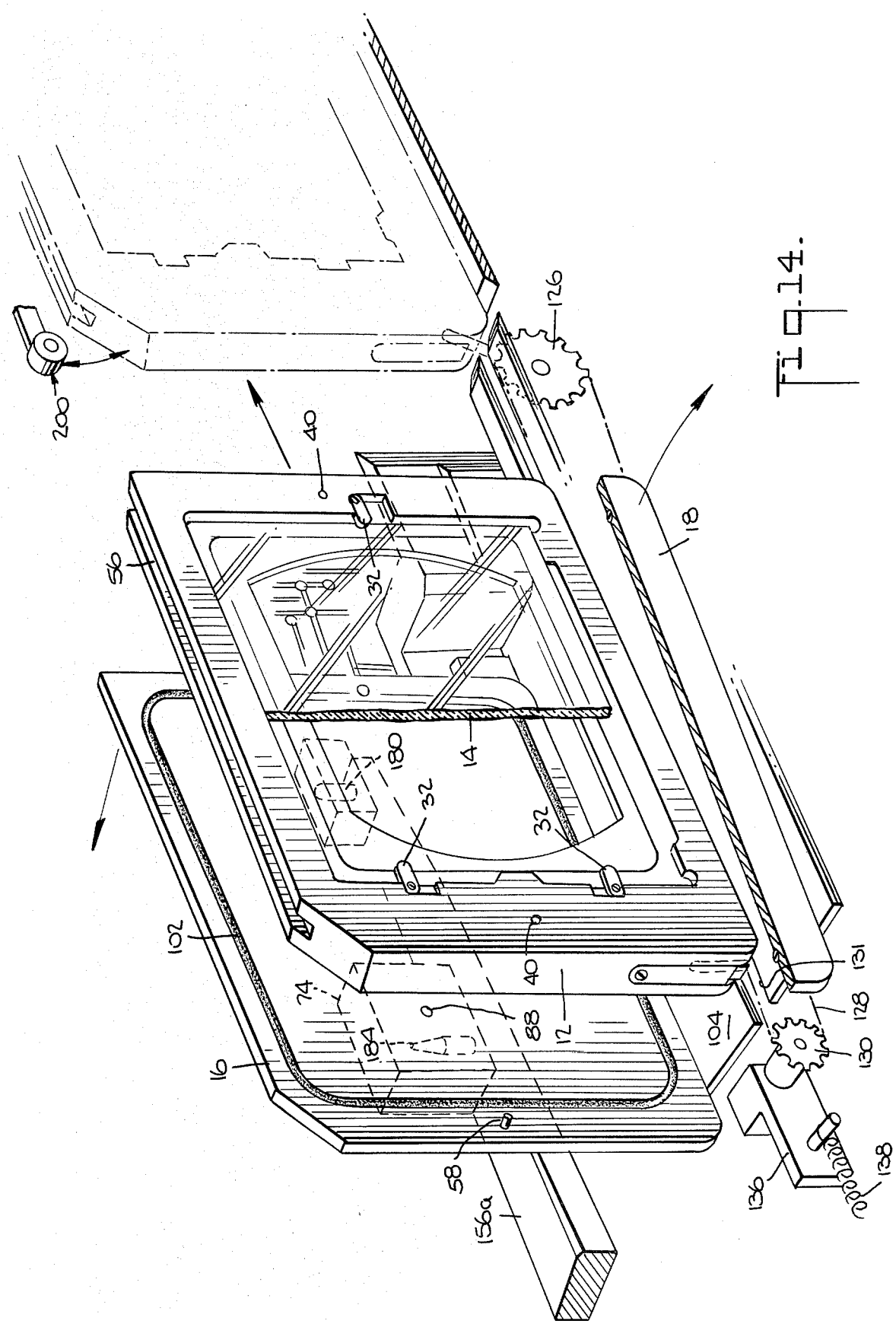

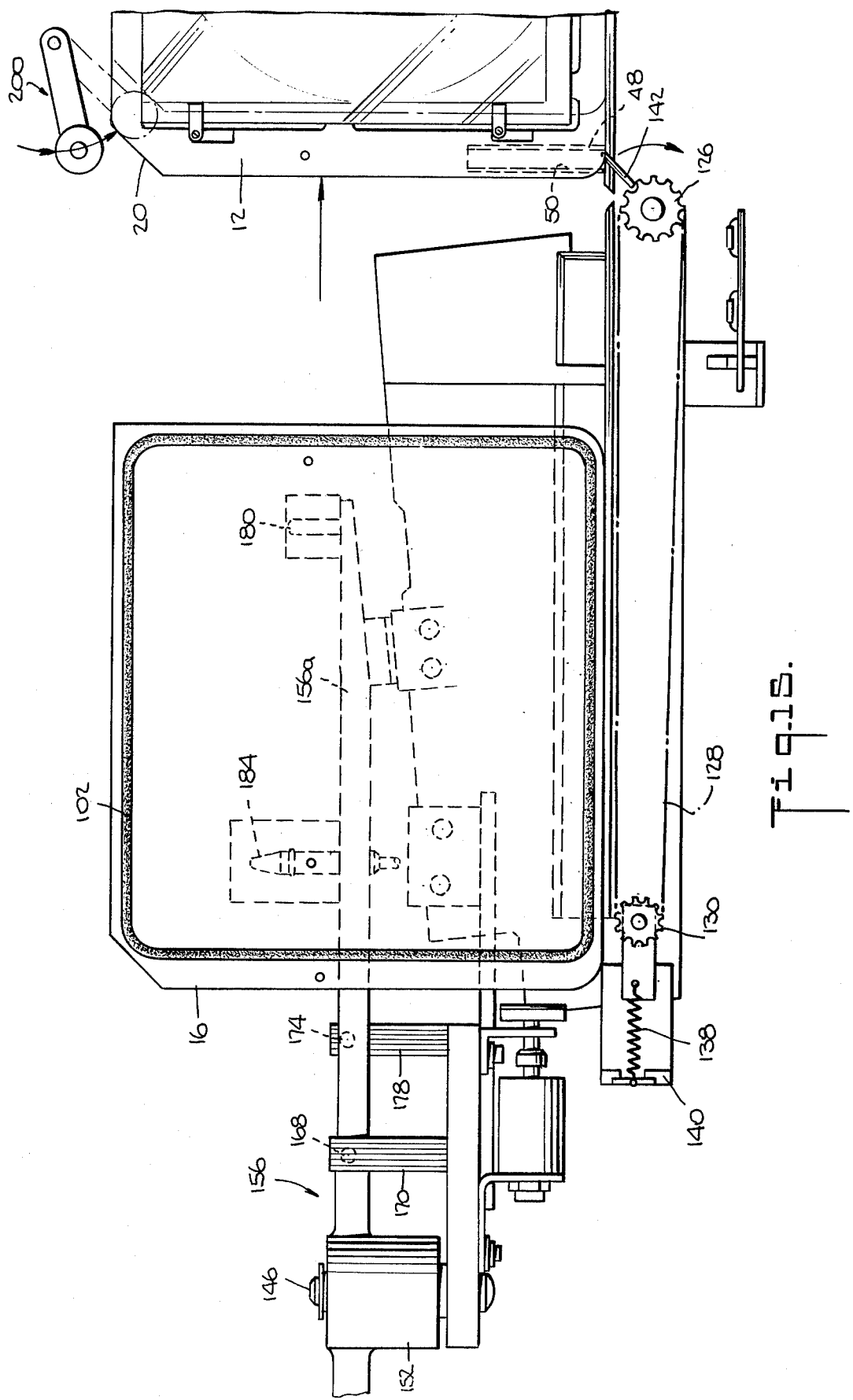

PROJECTION MASK STORAGE AND CARRIER SYSTEM

BACKGROUND OF THE INVENTION

A successful and widely used method of manufacturing integrated circuits employs an optical system and a glass mask. Deposited on one surface of the glass mask is a circuit pattern. The mask is inserted into the projection machine. The optical projection system of the machine projects an image of the mask onto the surface of the silicon wafer suitably prepared as, for example, by application of a coat of photoresist. Examples of such instruments are the "Micralign" projection mask alignment and exposure systems manufactured by Perkin-Elmer Corporation of Norwalk, Conn.

Great care must be taken to keep the mask as clean as possible. Even a single speck of dust may cause substantial difficulty. It will be readily understood that dust may easily be picked up by the mask during storage or when transported back and forth between storage and the instrument. Accordingly, it is a primary object of the present invention to provide a system for maintaining a mask in a clean environment through storage and during transport into and out of the projection stage of the instrument. Other objects are to provide such a system wherein the complete operation of unloading the mask from the cassette and reloading it, as well as evacuating or pressurizing the cassette carrier, is accomplished automatically. Other objects, features, and advantages will be apparent from the following description and appended claims.

SUMMARY OF THE INVENTION

The invention comprises a system for protecting a projection mask when outside a projection machine. The system comprises a mask carrier in the form of a hollow frame and means for selectively securing a mask within the frame. A pair of covers are engageable with opposite sides of the carrier frame in substantially gas-tight relationship, thereby forming a cassette enclosing the mask therein. In one embodiment, a gas passage is defined through at least one of the covers for transferring gas between the exterior and interior of the cassette. Included in the gas passage is a normally closed valve. Means are provided on the projection machine for receiving the cassette and opening the valve. The machine also includes means for causing a gas flow through the open valve. The cassette receiving portion of the machine includes means for engaging the covers and removing them from engagement with the carrier frame. Other means are provided for advancing the carrier and its contained mask to a projection location and returning them, whereby the cover engaging means may replace the covers on the carrier in preparation for removal from the machine.

BRIEF DESCRIPTION OF THE DRAWINGS

FIG. 4 is an enlarged detail of a portion of the carrier illustrating the means for securing the mask;

FIG. 5 is a perspective view of the mask receiving portion of a projection machine;

FIGS. 9 and 10 are enlarged cross-sectional details showing the operation of the cassette cover valve by the receiving apparatus;

FIG. 11 is an enlarged partial view of the cover displacement mechanism;

FIG. 12 is an enlarged vertical cross-section illustrating the mask carrier positioned on the receiving apparatus with its covers in place;

FIG. 13 is an illustration similar to FIG. 12 but showing the covers removed;

FIG. 14 is a perspective view partially broken away, illustrating the manner in which the uncovered carrier and mask are advanced into the projection machine.

FIG. 15 is an elevational view further illustrating the advancement of the mask into the machine;

DESCRIPTION OF THE PREFERRED EMBODIMENT

Cassette

Figure 1:
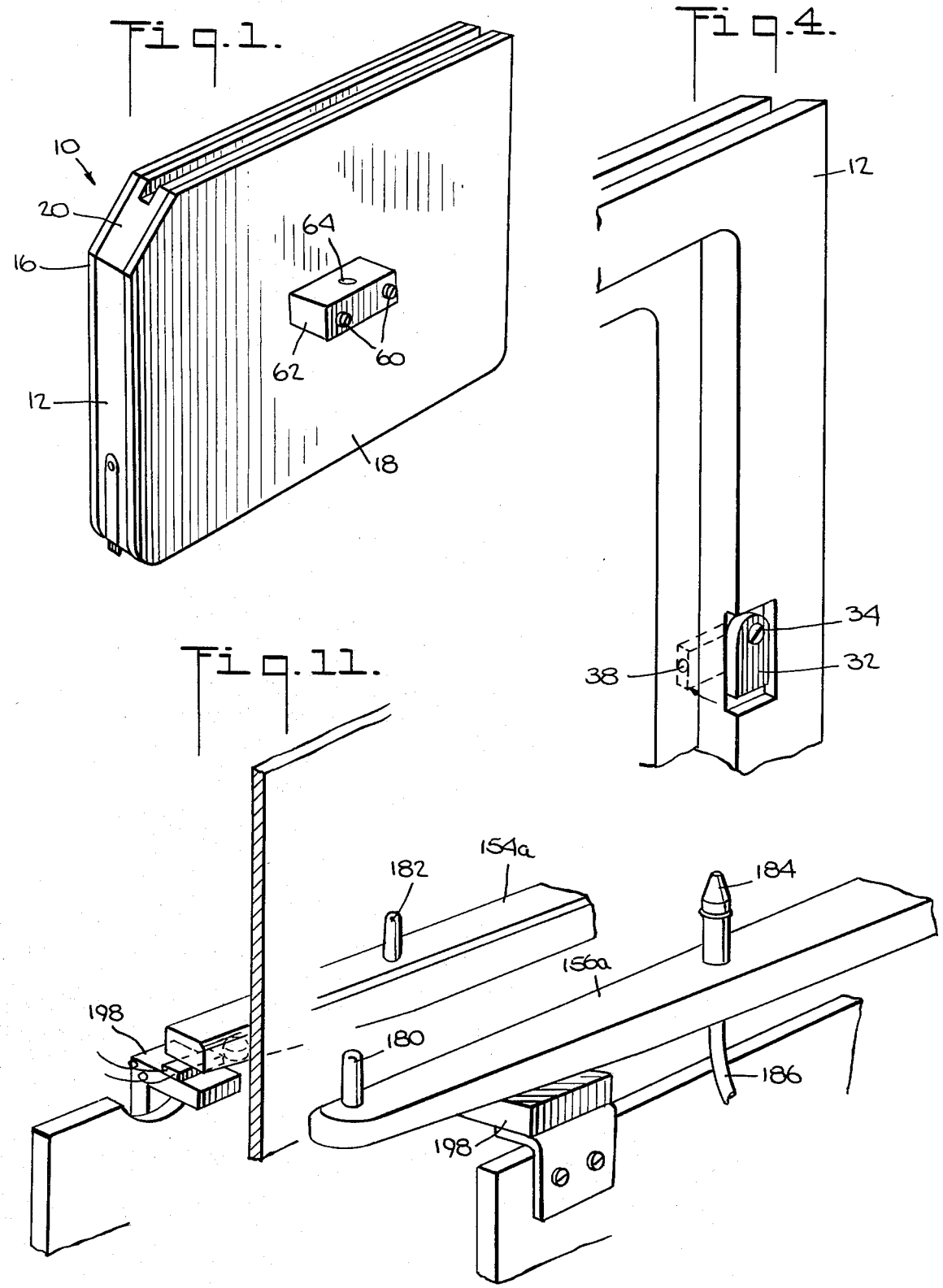
FIG. 1 is a perspective view of a projection mask cassette in accordance with the invention.
Figure 2:
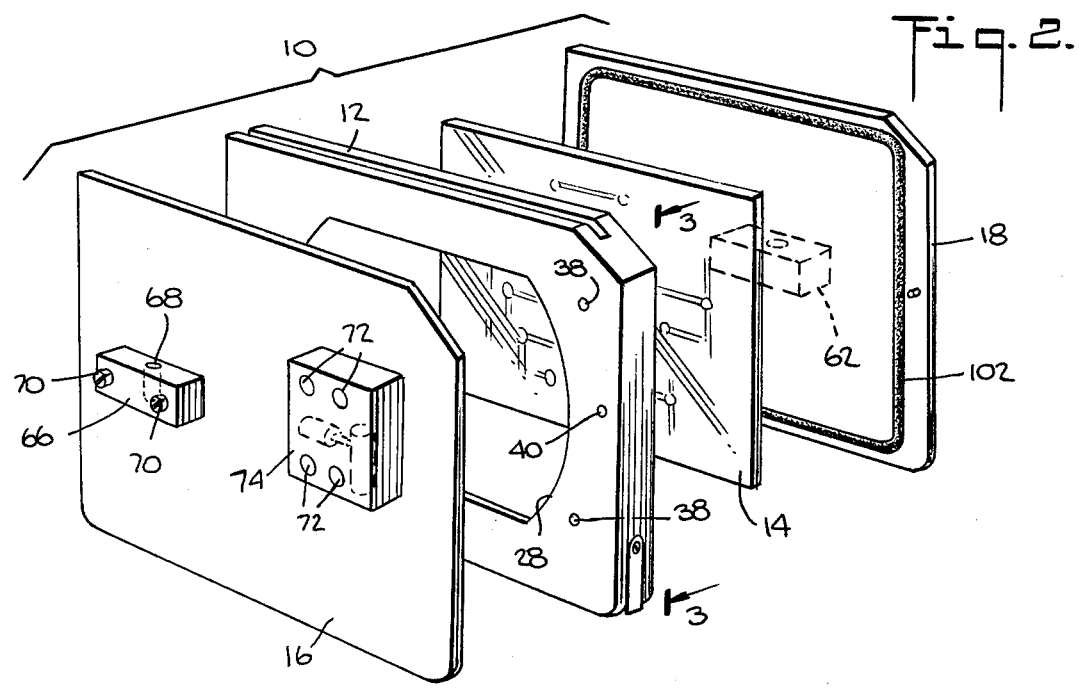
FIG. 2 is an exploded view of the carrier, mask, and covers forming the cassette of FIG. 1.
Figure 3:
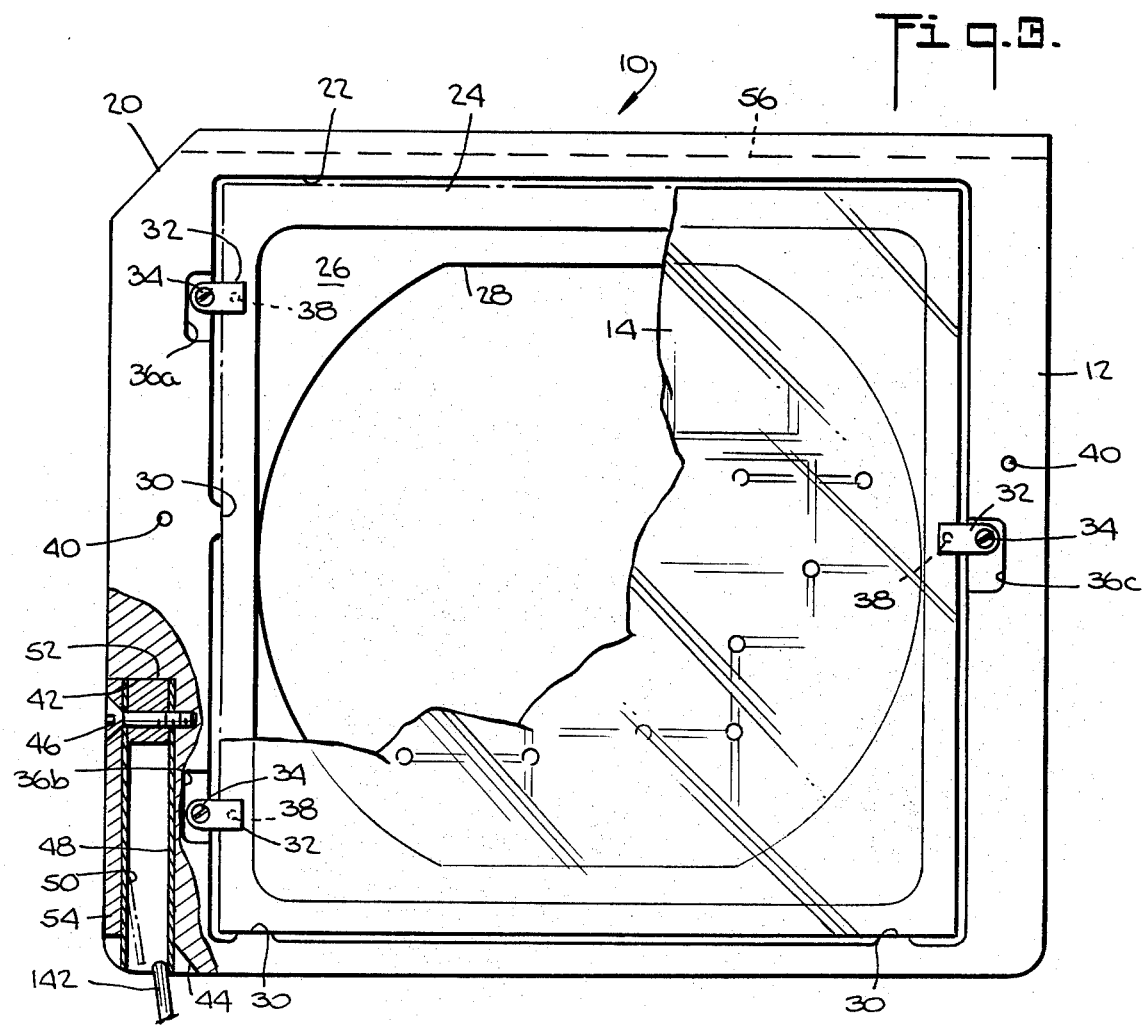
FIG. 3 is a cross-section, partially broken away, taken along the line 3—3 of FIG. 2.

With particular reference to FIGS. 1–4, there is illustrated a mask cassette 10. The cassette comprises a hollow, frame-like carrier 12, a projection mask 14 secured within the carrier, and a pair of plate-like covers 16, 18. The carrier 12 is essentially rectangular in shape, as illustrated in FIG. 3, and has its bottom corners rounded, and a chamfer 20 at its upper left corner (as viewed in FIG. 3). The near surface, as viewed in FIG. 3, defines a substantially square recess 22 which extends approximately halfway through the thickness of the frame as shown in FIGS. 12 and 13 to thereby provide an annular support surface 24 for the mask 14. Support surface 24 is inwardly bounded by a substantially rectangular relief area 26 which, in turn, terminates at a generally oval shaped window 28 which extends through the carrier from the opposite side.

The mask 14 which may be, as an example, approximately 3" square and ¼" thick, is mounted within the recess 22 and against the surface 24 with its edge positioned against projecting shoulders 30, extending inwardly from the recess 22. It is secured in this position by three tabs 32. As viewed in FIG. 3, two tabs are positioned to the left of the mask and one to the right of the mask. The tabs are pivotally mounted by means of screws 34 within recesses 36a, b, and c. Aligned with each of the tabs 32 and extending from the rear surface of the carrier 12 (as viewed in FIG. 3) is a plastic tipped adjustment screw 38 which bears against the mask 14. Cover alignment holes 40 are provided on the carrier 12, two on each major surface, positioned as viewed in FIG. 3 at either side of the mask opening.

At the lower left corner of carrier 12 (as viewed in FIG. 3) is a rectangular recess 42 which extends inwardly from the edge of the carrier. At its lower end, the recess is chamfered to provide a sloped surface 44. Mounted within the recess 42 by means of a screw 46 are a pair of leaf springs 48, 50 separated by a spacer 52 and backed by a metal backing strip 54. Along its upper edge, the carrier 12 defines a horizontal slot 56.

The covers 16, 18 are essentially flat plates shaped to fit the external outline of the carrier 12. Projecting from the inner surface of each cover are a pair of alignment pins 58 (FIG. 13) which engage the respective alignment holes 40 in the carrier 12. Mounted on the outer surface of the cover 18 (FIG. 1) and approximately centered thereon by means of screws 60 is a block 62 having a hole 64 drilled vertically therethrough. A similar block 66 (FIG. 2) having a vertical hole 68, is mounted on cover 16 by means of screws 70. However, it will be apparent from FIG. 2, that this block is positioned closer to one end of the cover than is true of block 62 relative to cover 18. Mounted near the opposite end of cover 16 by means of screws 72 is a larger block 74.

Turning to the cross-sectional illustration in FIG. 9, the block 74 will be seen to define a pair of mutually perpendicular passages. These include an essentially vertical cylindrical passage 76 which extends partially through the block from its lower surface. Communicating with the vertical passage 76 is a horizontal passage which includes a relatively large threaded portion 78 extending inwardly from the left edge of the block, a slightly smaller unthreaded central portion 80, and a small diameter terminal portion 82. Joining the central and terminal portions is a region which forms a conical valve seat 84. In addition to the two mutually perpendicular passages just described, there is a third passage 86 (FIG. 12) which extends at right angles to the central passage portion 80 and communicates with an opening 88 in cover 16.

Mounted within the horizontal passage formed by portions 78, 80, and 82 is a normally closed, spring loaded valve. The valve comprises a set screw 90 and a valve body 92 of generally cruciform cross-section terminating in a guide pin 94 within the passage terminal portion 82. The valve body 92 carries an O-ring 96 which is normally caused to seat against the valve seat 84 by means of a coiled compression spring 98.

The inner surface of each of the covers 16, 18 is circumscribed by a groove 100 (FIG. 13) which carries a resilient sealing strip 102. When the covers 16, 18 are forced against the opposite sides of the carrier 12, these strips deform as shown in FIG. 12 to form a gastight seal.

Receiving Station

Figure 6:
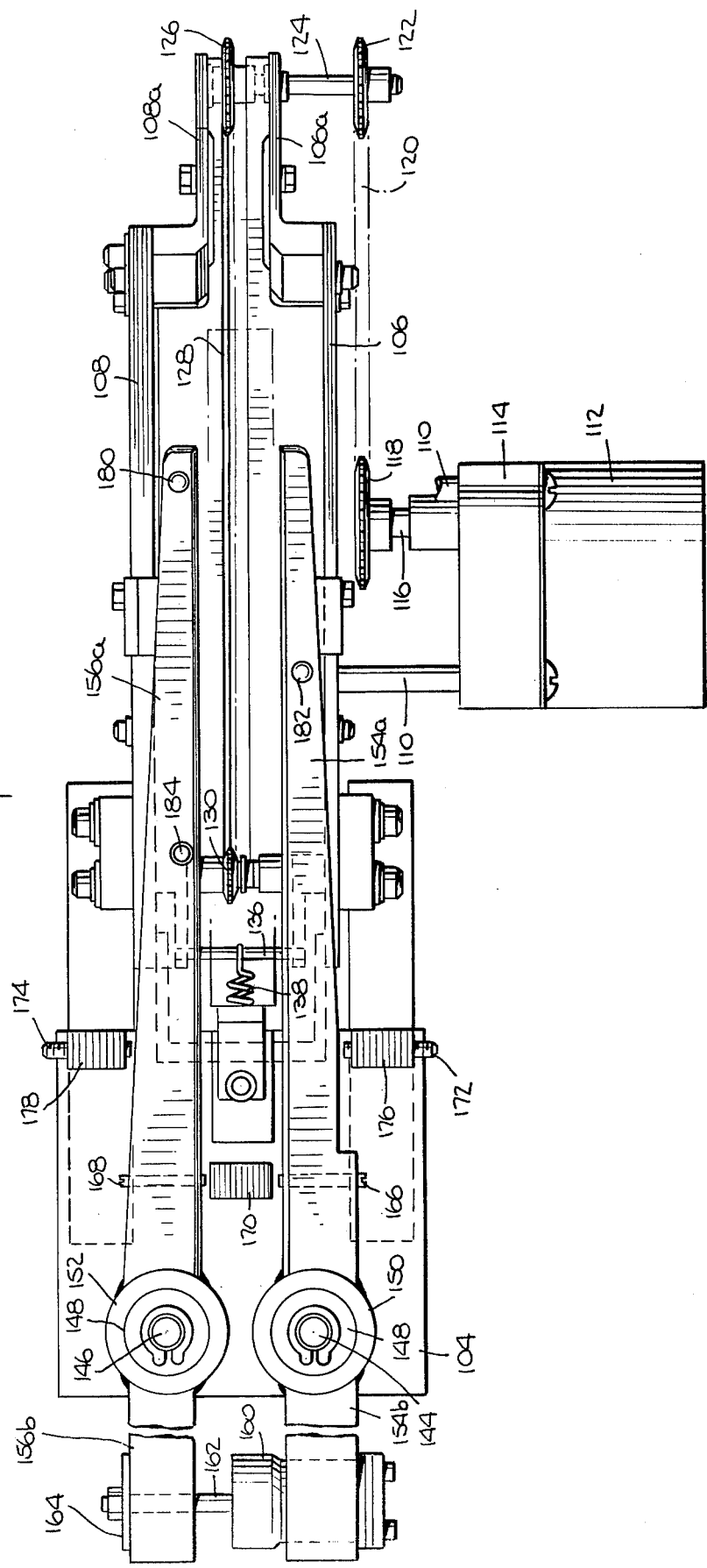
FIG. 6 is a plan view of the mask receiving apparatus of FIG. 5.
Figure 7:
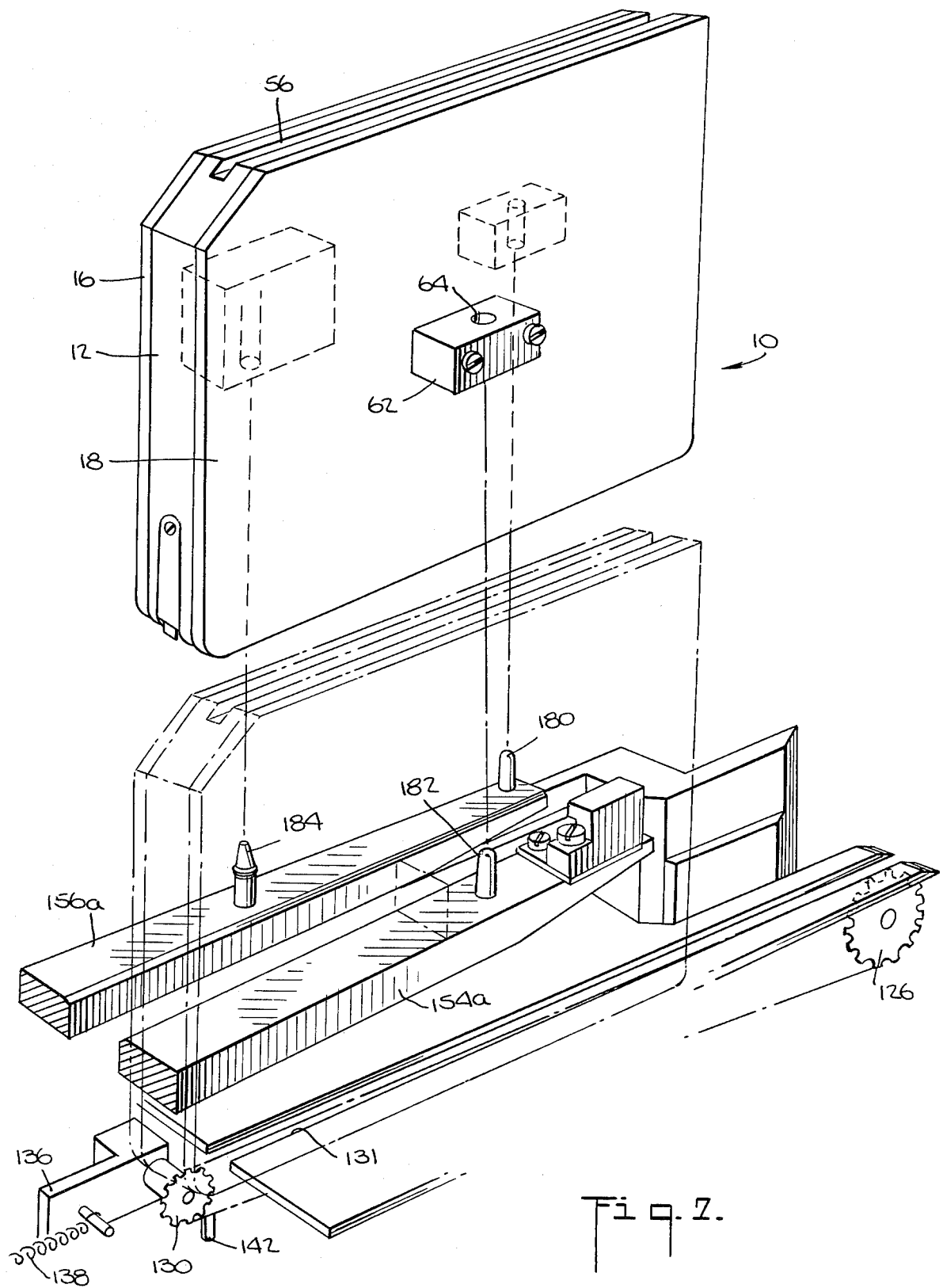
FIG. 7 is a perspective view illustrating the manner in which a mask cassette is received by the mask receiving apparatus.
Figure 8:
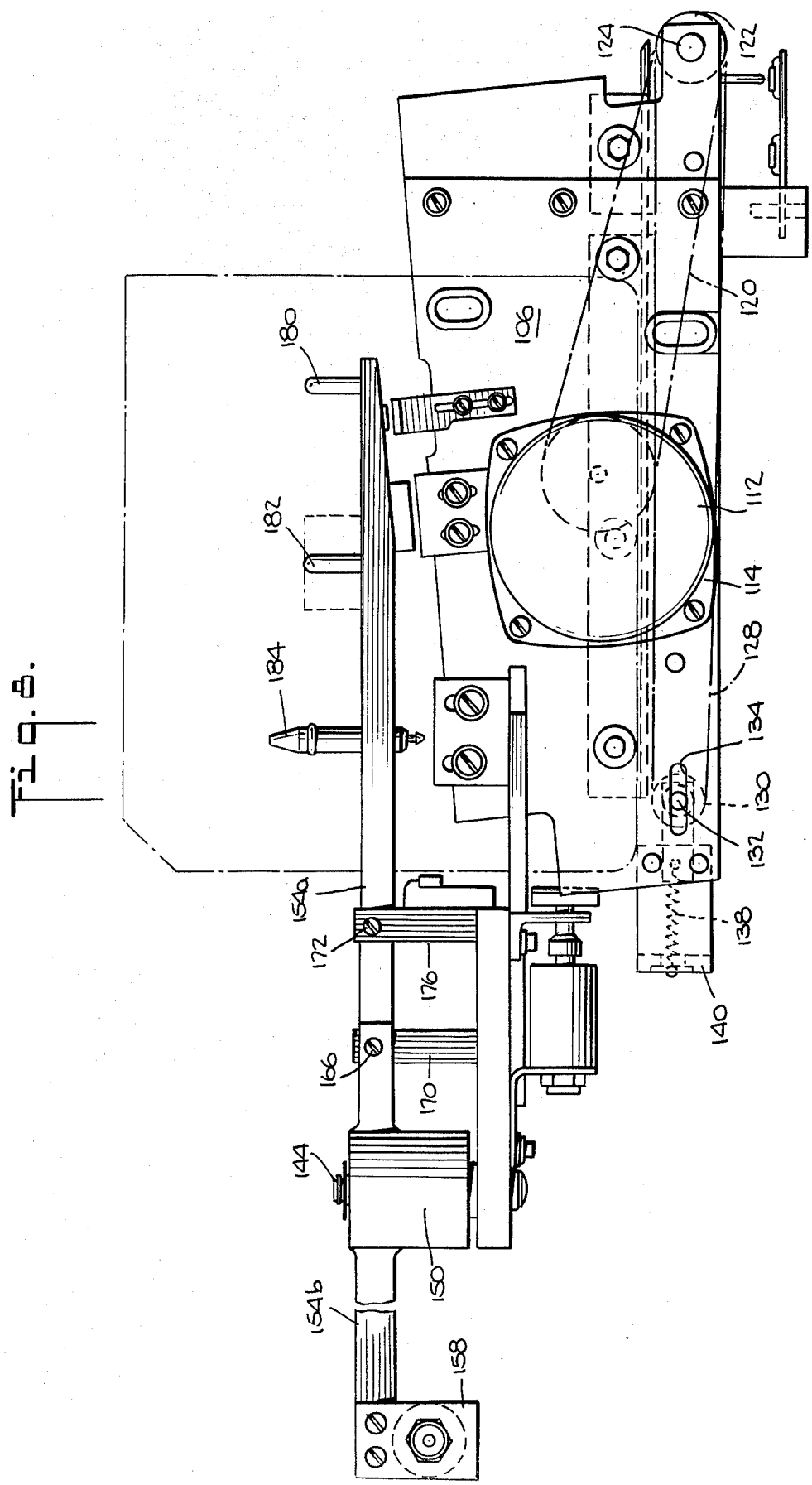
FIG. 8 is an elevational view of the apparatus of FIGS. 5 and 6.

Incorporated within the projection machine is a receiving station into which the mask carrier assembly is inserted. The receiving station is illustrated in detail in FIGS. 5, 6, and 8. It includes a basic frame structure which need not be described in detail, except to note that it includes a horizontal base plate 104 and a pair of spaced, parallel side frames 106, 108. Mounted to the side frame 106 by means of posts 110 is a motor 112 and gear box 114 unit. Extending inwardly from the gear box 114 is an output shaft 116 which carries a sprocket 118. Sprocket 118 drives a chain 120. Chain 120, in turn, drives sprocket 122, which is mounted on a common shaft 124 with a transport sprocket 126. As will be apparent from FIG. 6, the sprocket 126 is mounted between a pair of bracket extensions 106a, 108a of side frames 106, 108. The shaft 124 is supported by these brackets in suitable bearings. A transport chain 128 passes around the transport sprocket 126 and over an idler sprocket 130. The upper run of chain 128 lies just beneath a slot 131 (FIG. 7) in base plate 104. The idler sprocket 130 is supported on a shaft 132 in a pair of aligned slots 134 in side frames 106, 108. The shaft 132 is connected through a yoke 136 to a tension coil spring 138 which is anchored to a bracket 140 so as to keep the transport chain under tension. Secured to the transport chain 128 for travel therewith, is an outwardly extending "flag" 142 (FIGS. 15, 16) having a length sufficient to extend through slot 131.

Extending upwardly from the base plate 104 are a pair of aligned shafts 144, 146. Mounted for rotation on these shafts by means of suitable bearings 148 are a pair of cylindrical bosses 150, 152. Each of these bosses is integral with an elongated lever arm 154, 156, each of which has a longer portion 154a, 156a extending to the right, as viewed in FIG. 5, and a shorter portion 154b, 156b extending to the left. Mounted at the extreme end of arm portion 154b, by means of a bracket 158, is a pneumatic cylinder 160. The piston rod 162 of cylinder 160 is, in turn, secured to a bracket 164 on arm portion 156b.

It will be apparent, of course, that actuation of the pneumatic cylinder will either pull the arm portions 154b, 156b together or force them apart, thereby causing the lever arms 154, 156 to rotate about their respective shafts 144, 146. An inward limit stop is provided by screws 166, 168 in cooperation with a central block 170. Outer limit stops are provided by screws 172, 174 mounted in respective outer blocks 176, 178.

The extreme end of arm portion 156a carries a cover engaging pin 180. A similar pin 182 is carried by arm portion 154a but is spaced closer to the shaft 144. In addition to pin 180, the arm portion 156a also carries an upwardly extending vacuum nozzle 184. The spacing of pins 180, 182 and nozzle 184 is such as to engage the holes 64, 68, and the passage 76, respectively, on the covers 16, 18 when secured to the mask carrier 12.

The vacuum nozzle 184 is connected to a vacuum source by means of a flexible vacuum tube 186. The construction of the vacuum nozzle 184 will be more apparent from the following description taken in connection with the illustration of FIG. 9. It will be noted that the nozzle is basically cylindrical and defines a longitudinal passage 188. At its upper end, the nozzle 184 terminates in a smaller diameter portion 190 and a taper 192. Immediately below the smaller diameter portion 190 is an encircling groove 194 carrying an O-ring 196.

Figure 16:
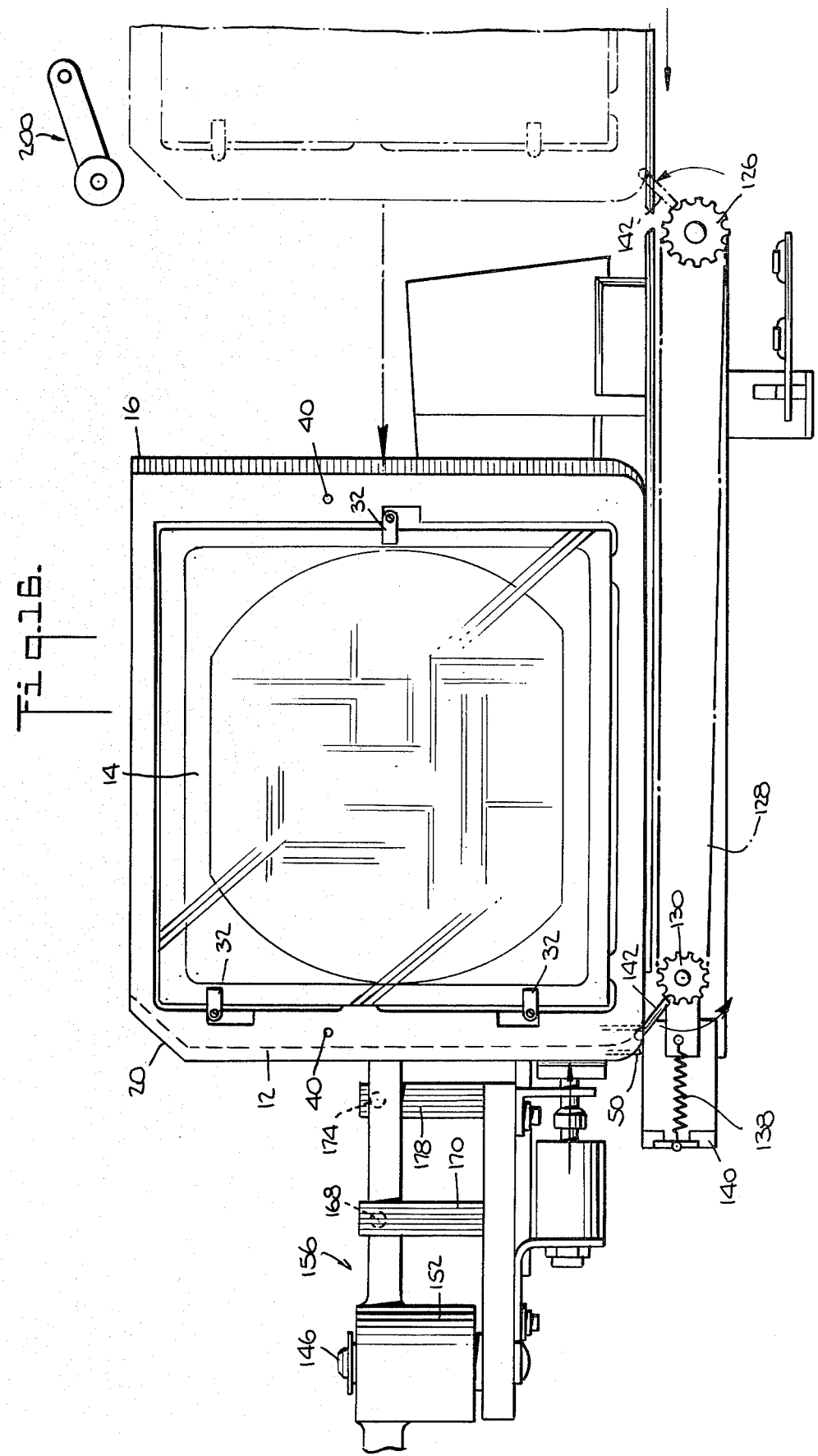
FIG. 16 is a view similar to FIG. 15 but illustrating the retraction of the mask and its carrier to the receiving apparatus.

Hall effect switches 198 (FIG. 11) are mounted to detect lever arm position. Although not actually forming a part of the present invention, there is illustrated in FIGS. 14–16 a mask clamp roller 200 which forms a portion of the projection machine within which the mask is used.

OPERATION

Assume that a projection mask 14 which it is desired to employ in a projection machine is stored in a mask cassette 10—that is, within a carrier 12 on which are mounted covers 16 and 18. The interior of the cassette is evacuated, the vacuum being maintained by sealing strips 102. The arms 154, 156 are positioned with their longer portions 154a, 156a closest together. The operator lowers the cassette 10 into position between the arms 154, 156 such that cover engaging pin 182 enters the hole 64 in the block 62 on cover 18 and the pin 180 on arm 156 enters hole 68 in block 66 on cover 16. At the same time, the vacuum nozzle 184 enters the passage 76 in the block 74.

Referring now to FIG. 9, it will be noted that the vacuum is retained within the cassette by means of the normally closed valve provided by the valve body 92, the O-ring 96, and the valve seat 84. As block 74 descends over the nozzle 184, the pin 194 is contacted by the taper 192 on the nozzle and is pushed inwardly to thereby open the valve to the position illustrated in FIG. 10. It will be noted that the interior of the cassette is then in communication with the nozzle passage 188. After so positioning the mask cassette, the operator may close the machine, returning it to a sealed condition and institute the loading action by an external switch.

The vacuum within the cassette may now be released through the vacuum line 186 by interior valving (not shown). Once the vacuum has been released, the pneumatic cylinder 160 may be operated to draw together the short portions 154b, 156b of the lever arms thereby separating the long portions 154a, 156a. As a result of this action, the two covers 16, 18 are removed from the carrier 12 as illustrated in FIG. 14, leaving the carrier positioned on the base 104 directly over the slot 131 and transport chain 128.

Motor 112 is next actuated, driving the transport chain 128 through the gear box 114 and the chain 120, the rotation of the sprockets 126, 130 being clockwise as viewed in FIGS. 14–16. The flag 142 attached to the transport chain 128 advances to and engages the carrier 12. Referring now to FIG. 3, it is seen that the flag 142 first engages the leaf spring 50 which moves to the right, as shown in dotted lines, and then releases the flag which engages the leaf spring 48. Thereafter, further travel of the flag 142 to the right drives the carrier 12 to the right as illustrated in FIG. 15, leaving behind the covers 16, 18. The carrier and its mask are thereby advanced into the projection machine where it is locked into place by means of mask clamp roller 200 bearing against the chamfered corner 20 in conventional manner.

When the projection step is complete, the operation is reversed. The sprockets 126, 130 now rotate counter-clockwise as shown in FIG. 16. The flag 142 displaces leaf spring 48 while engaging spring 50 and thereby moves the carrier 12 and mask to the left returning it to the original position between the covers 16, 18. It remains in this position while the pneumatic cylinder 160 is once again activated to spread apart the short lever arm portions 154b, 156b and thereby close the long arm portions 54e, 156a repositioning the covers on either side of the carrier 12, simultaneously compressing the sealing strips 102 as shown in FIG. 12. Thereafter, vacuum is applied through the vacuum nozzle 184 to fully evacuate the interior of the assembly through the open valve as shown in FIG. 10. By virtue of the vacuum, the covers are retained tightly against the carrier without the requirement of any other clamping or locking means. At this point, the cassette 10 may be removed by the operator, the act of removal from the nozzle 184 causing the valve to return to its normally closed state, maintaining the vacuum. After removal, the vacuum sealed cassette may be stored until its use is next required.

MODIFICATION

Figure 17:
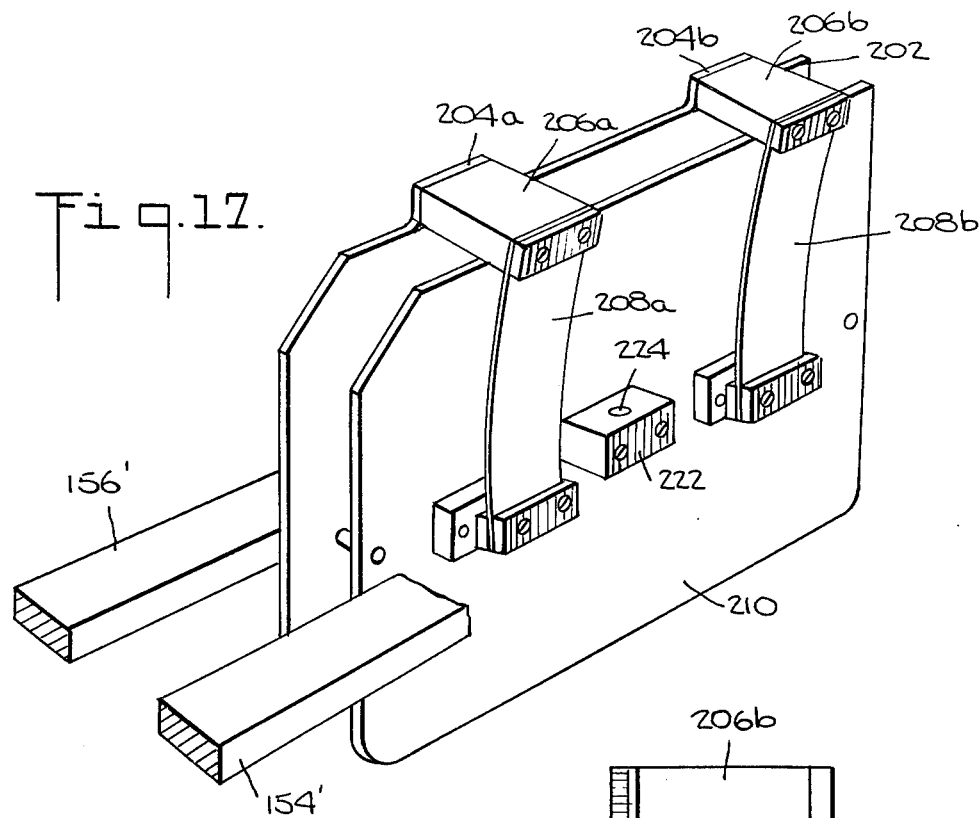
FIG. 17 is a perspective view of a modified mask cover construction.
Figure 19:
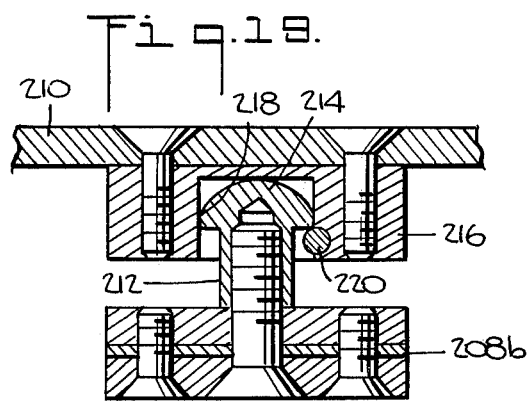
FIG. 19 is an enlarged detail taken along the line 19—19 of FIG. 18.
Figure 18:
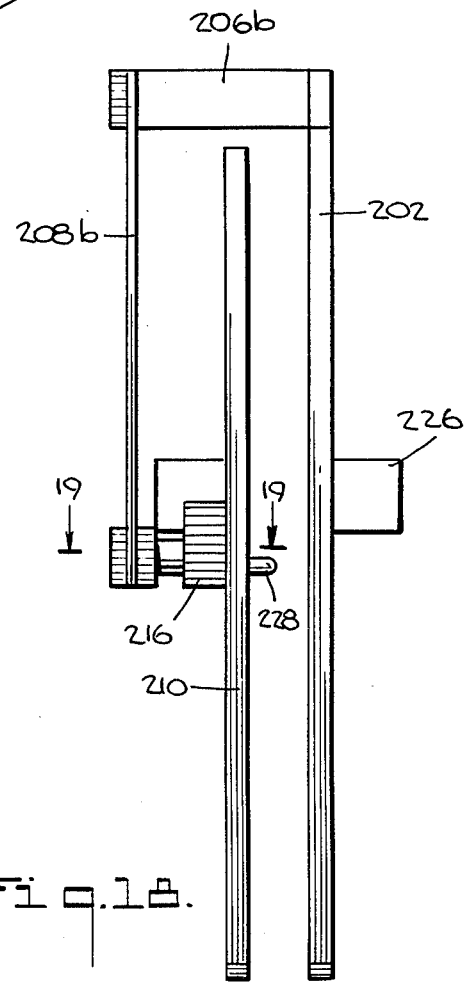
FIG. 18 is a right end view of the FIG. 17 modification.

In FIG. 17, there is illustrated a modification wherein the covers do not form a gas-tight seal with the carrier. The covers are connected together by means of springs to form a unitary assembly. One cover 202 includes a pair of spaced protrusions 204a, 204b which extend from its upper edge. Mounted to these protrusions are a pair of spaced brackets 206a, 206b. Secured to the ends of the brackets and extending downwardly therefrom are a pair of leaf springs 208a, 208b. The lower end of each of the leaf springs is connected to a cover 210 which is normally parallel to and spaced from the cover 202, as shown in FIG. 18. The lower end of each of the springs 208 is connected to the cover 210 by means of a swivel joint, as shown in FIG. 19. Secured to the lower end of leaf spring 208b is a post 212 which has an enlarged head 214. Secured to the cover 210 is a block 216 which defines a recess 218 receiving the head 214. The latter is retained within the recess by means of a pin 220 through the block 216.

Cover 210 also carries a block 222 having a vertical hole 224 which is engaged by a pin extending upwardly from the lever arm 154' as previously explained. A similar block 226 is carried by cover 202 for engagement by a pin extending upwardly from lever arm 154'. The inner surface of the cover 210 also carries a pair of spaced pins 228 which engage suitable openings within the mask carrier.

FIG. 18 illustrates the cover assembly in its normal condition with the spacing between covers 202, 210 being slightly less than the thickness of a mask carrier. When placed upon a carrier, a cassette is formed. Removal of the covers within the projection machine is accomplished in essentially the same way as previously described. As the lever arms 154' and 156' separate, the covers 202, 210 are also separated against the force of the springs 208a, 208b. Upon return of the mask carrier, the lever arms close, permitting the covers to reengage the carrier.

It is believed that the many advantages of this invention will now be apparent to those skilled in the art. It will also be apparent that a number of variations and modifications may be made in the invention without departing from its spirit and scope. For example, as described above, in one version the cassette is evacuated. However, the invention also encompasses the concept of storing the mask in a pressurized gas environment such as, for example, nitrogen. Essentially the same apparatus could be employed, although some modifications would be made in the covers to provide a positive locking mechanism. Other modifications and variations will suggest themselves to those skilled in the art. Accordingly, the foregoing description is to be construed as illustrative only, rather than limiting. This invention is limited only by the scope of the following claims.

What is claimed is:
1. A system for protecting a projection mask used in a projection machine which comprises:
   a mask carrier in the form of a hollow frame and means for selectively securing a mask therein;
   first and second covers engageable with opposite sides of said carrier frame, thereby forming a cassette enclosing said mask therein;
   means in said projection machine for receiving said cassette;

means associated with said receiving means for engaging said first and second covers and removing them from, and replacing them into, engagement with said carrier frame; and means for advancing said carrier and its contained mask to a projection location and returning them to said receiving means, whereby said cover engaging means may replace said covers on said carrier in preparation for removal from said machine.

2. The system of claim 1 wherein said first and second covers include resilient means for urging said covers towards each other and into engagement with said carrier frame.

3. The system of claim 2 wherein said resilient means comprises: a leaf spring having a first and a second end; spring mounting means on one of said covers securing said spring first end; and spring engaging means on the other of said covers for flexibly engaging said spring second end.

4. The system of claim 2 wherein said resilient means comprises:
first and second spaced brackets supported by said first cover at their first ends and extending substantially perpendicular to the planes of said first and second covers, the second ends of said brackets extending beyond the plane of said second cover;
first and second substantially parallel leaf springs having first ends secured to the second ends of the respective brackets and second ends overlying said second cover; and
first and second engaging means on said second cover for flexibly engaging said spring second ends.

5. A system for protecting a projection mask used in a projection machine which comprises:
a mask carrier in the form of a hollow frame and means for selectively securing a mask therein;
first and second covers engageable with opposite sides of said carrier frame in substantially gas-tight relationship thereto, thereby forming a cassette enclosing said mask therein;
a gas passage defined by at least one of said covers for transferring gas between the exterior and interior of said cassette;
a normally closed valve in said gas passage;
means in said projection machine for receiving said cassette and opening said valve;
means for flowing gas through the opened valve;
means associated with said receiving means for engaging said first and second covers and removing them from, and replacing them into, engagement with said carrier frame; and
means for advancing said carrier and its contained mask to a projection location and returning them to said receiving means, whereby said cover engaging means may replace said covers on said carrier in preparation for removal from said machine.

6. The system of claim 5 wherein said gas flowing means comprises a vacuum source.

7. The system of claim 5 wherein said engaging means comprises:
first and second spaced support members positioned in a first relationship to engage, respectively, said first and second covers when said cassette is placed therebetween;
means for securing each of said support members to its respective cover; and
means for moving said support members between positions corresponding to said first relationship and a second relationship wherein said covers are separated from said carrier frame.

8. The system of claim 7 wherein said support members comprise:
first and second lever arms, each rotatable about a pivot.

9. The system of claim 8 wherein said moving means comprises:
means for rotating said lever arms, substantially simultaneously, in opposite directions of rotation.

10. The system of claim 9 wherein said rotating means comprises:
a linear actuator connected to both said lever arms.

11. The system of claim 10 wherein said actuator comprises:
a pneumatic cylinder.

12. The system of claim 7 wherein said securing means comprises:
a pin on one of said support member and cover; and
a pin-receiving hole defined by the other of said support member and cover.

13. The system of claim 5 or 7 wherein said valve comprises:
a valve seat formed in said gas passage;
a reciprocable valve stem in said gas passage;
a valve member carried by said stem and engageable with said seat; and
means for resiliently biasing said stem to engage the valve member with said seat.

14. The system of claim 13 wherein the means for opening said valve comprises:
a nozzle advanceable into said gas passage to engage and displace said stem against said biasing means.

15. The system of claim 14 wherein said gas flow means comprises:
a vacuum source connected to said nozzle.

16. The system of claim 5 or 7 wherein said carrier advancing means comprises:
an endless conveyor extending between said receiving means and said projection location;
means for drivingly engaging said carrier by said conveyor; and
means for reversibly driving said conveyor and engaged carrier.

17. The system of claim 16 wherein said driving engagement means comprises:
a projecting flag extending outwardly from said conveyor for travel therewith; and
means on said carrier for driven engagement by said flag.

18. A cassette for protecting a projection mask which comprises:
a mask carrier in the form of a hollow frame and means for selectively securing a mask therein;
first and second covers engageable with opposite sides of said carrier frame in substantially gas-tight relationship thereto to enclose said mask therebetween;
a gas passage defined by at least one of said covers for transferring gas between the exterior and interior of said cassette; and
a normally closed valve in said gas passage.

19. The cassette of claim 18 wherein:
opposed major surfaces of said frame lie in spaced, substantially parallel planes; and
each of said covers includes a resilient seal positioned to engage one of said major surfaces and encircle said hollow frame.

20. The cassette of claim 19 wherein:
said covers are substantially flat;
one of said covers carries a projection on its external surface, said projection and cover defining said gas passage therethrough, the outermost segment of said gas passage being in said projection and spaced from, and parallel to, the plane of said external surface.

21. The cassette of claim 20 wherein:
an intermediate segment of said gas passage is defined by said projection and intersects substantially normal with said outermost segment;
said valve is enclosed within said intermediate segment and includes an actuating member extending into said outermost segment for opening of said valve by an object inserted into said outermost segment.

22. The method of protecting a projection mask and automatically positioning said mask within a projection machine which comprises:
providing a mask carrier in the form of a hollow frame;
securing said mask within said carrier;
applying first and second covers to said carrier on opposite sides of said mask;
evacuating the interior of the covered carrier to secure said covers and provide a protective atmosphere for said mask;
placing the evacuated covered carrier in a receiving area within said machine;
releasing the vacuum within said covered carrier;
separating said first and second covers from said carrier;
advancing said carrier and mask to an exposure location within said machine;
retracing said carrier and mask to said receiving area;
replacing said first and second covers on said carrier;
reevacuating the interior of the covered carrier; and
removing the evacuated covered carrier from said receiving area.

* * * * *